(12) United States Patent
Bronner et al.

(10) Patent No.: US 6,180,972 B1
(45) Date of Patent: *Jan. 30, 2001

(54) BURIED, IMPLANTED PLATE FOR DRAM TRENCH STORAGE CAPACITORS

(75) Inventors: Gary B. Bronner, Stormville, NY (US); Wilfried Hansch, South Burlington; Wendell P. Noble, Milton, both of VT (US)

(73) Assignees: International Business Machines Corp., Armonk, NY (US); Infineon Technologies Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/679,799

(22) Filed: Jul. 15, 1996

Related U.S. Application Data

(62) Division of application No. 08/580,816, filed on Dec. 19, 1995, now Pat. No. 5,908,310.

(51) Int. Cl.$^7$ ................................................ H01L 27/108
(52) U.S. Cl. .......................................... 257/301; 257/304
(58) Field of Search .................................. 257/296, 307, 257/304

(56) References Cited

U.S. PATENT DOCUMENTS

| | | |
|---|---|---|
| 4,688,063 | 8/1987 | Lu et al. . |
| 4,792,834 | * 12/1988 | Uchida ................................ 257/304 |
| 4,794,434 | 12/1988 | Pelley, III . |

(List continued on next page.)

FOREIGN PATENT DOCUMENTS

| | | |
|---|---|---|
| 0283964 | 9/1988 | (EP) . |
| 0298421 | 1/1989 | (EP) . |
| 228367 | 1/1990 | (JP) . |
| 2135776 | 5/1990 | (JP) . |

OTHER PUBLICATIONS

"New Well Structure for Deep Sun–um CMOS/BICMOS Using Thin Epitaxy Over Buried Layer and Trench isolation"; Y. Okazaki et al,; NTT LSI Laboratories; 1990 Symposium on VLSI Technology; 1990 IEEE; pp. 83–84, 6/90.

"A 45—ns 16–Mbit DRAM with Triple–Well Structure"; Syuso Fujii et al; IEEE Journal of Solid–State Circuits, vol. 24, No.5, Oct. 1989; pp. 1170–1175.

*Primary Examiner*—Mark V. Prenty
(74) *Attorney, Agent, or Firm*—McGuireWoods LLP; Howard J. Walter

(57) ABSTRACT

A buried plate particularly suitable for formation of a common plate of a plurality of trench capacitors, such as are employed in dynamic random access memories, is formed by implantation of impurities in one or more regions of a wafer or semiconductor layer, epitaxially growing a layer of semiconductor material over the implanted regions and diffusing the implanted impurities into the wafer or semiconductor layer and into the epitaxial layer. Diffusion from such a source avoids process complexity compared with provision of diffusion sources within capacitor trenches and further provides an impurity concentration profile which varies with depth within the resulting body of semiconductor material, resulting in a well-defined boundary of the buried plate and an isolation region both above and below the buried plate. The structure allows biasing of the buried plate as desired, such as for reducing electrical stress on the capacitor dielectric to allow reduction in thickness thereof and reduction of area required for the trench capacitor.

3 Claims, 2 Drawing Sheets

U.S. PATENT DOCUMENTS

| | | |
|---|---|---|
| 4,801,988 | 1/1989 | Kenney . |
| 4,829,017 * | 5/1989 | Malhi . |
| 4,873,560 | 10/1989 | Sunami et al. . |
| 4,905,065 * | 2/1990 | Selcuk et al. ......................... 257/301 |
| 4,920,389 | 4/1990 | Itoh . |
| 5,006,909 | 4/1991 | Kosa . |
| 5,065,273 * | 11/1991 | Rajeevakumar ..................... 257/301 |
| 5,250,829 | 10/1993 | Bronner et al. . |
| 5,264,716 | 11/1993 | Kenney . |
| 5,336,912 * | 8/1994 | Ohtsuki ................................ 257/301 |
| 5,384,474 | 1/1995 | Park et al. . |
| 5,442,211 * | 8/1995 | Kita ..................................... 257/301 |
| 5,908,310 * | 9/1999 | Bronner et al. ...................... 438/171 |

* cited by examiner

BURIED, IMPLANTED PLATE FOR DRAM TRENCH STORAGE CAPACITORS

CROSS REFERENCE TO RELATED APPLICATION

This application is a division of application Ser. No. 08/580,816 filed Dec. 27, 1995 now U.S. Pat. No. 5,908,310.

BACKGROUND OF THE INVENTION

1. Field of the Invention

The present invention generally relates to integrated circuit memories and, more particularly, to the formation of a plate for trench storage capacitors particularly as used in dynamic random access memories (DRAMs).

2. Description of the Prior Art

Basic and indispensable operations of digital data processing circuits involve the ability to fetch one or more sequences of digital signal bits from memory, perform an operation thereon and return the result to storage. Therefore, memory structures from which signals can be accessed and to which signals can be stored in a cycle time comparable to an operating cycle of the processing circuit have been required. To answer this requirement random access memories of both static and dynamic types have been developed and their respective designs continually refined over the years.

Recent advances in digital data processing circuits has greatly increased requirements for large capacity and improved functionality of storage which may be rapidly accessed by the processing circuitry in cycle times which have become extremely short. Dynamic random access memories have generally been used to answer the requirement of increased storage capacity since data is stored therein as charge on a capacitor which can be fabricated at extremely small size and in very large numbers on a single semiconductor chip. A well-known and widely used capacitor structure occupying an extremely small area on a chip is known as a trench capacitor which, in a basic form includes a capacitor dielectric and an electrode, as one capacitor plate, formed within a blind aperture (often oval in plan view) generally referred to as a trench, in a substrate; using a region within the substrate as the second capacitor plate common to the trench capacitors on the chip.

As is understood by those skilled in the art, storage or retrieval of signals is achieved in modern, high-capacity DRAMs by the storage of very small amounts of charge. Stored charge is also subject to leakage and must be periodically refreshed in order to avoid corruption of data and while the amount of stored charge remains sufficient to provide rapid and reliable response of sense amplifiers, generally by a "read and write back" combination of operations for each cell and which can be performed simultaneously or concurrently in parallel in different partitions of memory.

The speed with which writing can be done at a given voltage depends, to a large degree, on the parasitic series resistance of the memory cell capacitors. Therefore, it is often desirable to form a structure of enhanced conductivity to serve as a common capacitor plate for the memory cells on a chip or in a partition thereof. Such structures may also facilitate isolation of cells from mutual parasitic coupling effects. As a further refinement, as memory cells have become more densely integrated on a chip, applying a bias to such a conductive structure approximating a voltage mid-way between the logic signal levels allows reduction of electrical field and stress on the capacitor dielectric which can thus be made thinner. Reduction of the dielectric thickness, consistent with the levels of electrical stress which must be tolerated, increases capacitance of each trench capacitor and potential amount of charge storage at a given voltage and allows the "footprint" of each capacitor to be reduced. In view of the number of memory cells which can currently be fabricated on a chip, seemingly slight reductions in cell footprint can provide substantial chip space for further memory cells, so-called peripheral circuits for increased memory functionality and redundant circuits to increase manufacturing yield.

Some of the read, write and refresh operations as well as differentiation between partitions of memory can be facilitated by biasing the electrode which forms a common capacitor plate for a plurality of capacitors. Particularly as to differentiation between partitions, if partitions are provided, separate and mutually isolated common electrodes must be provided which, of course, cannot be done if the substrate forms a common electrode for all storage capacitors on the chip. Additionally, the extent of any such electrode must be readily determinable as an incident of chip design in order to avoid interference with other circuitry provided on the chip to allow access to memory cells and to store and recover data, such as address decoders, sense amplifiers and peripheral circuits.

Therefore, in recent DRAM designs, a separate, independently biasable electrode has been included by a buried doped region within the substrate, such as an n-type region within a p-type substrate and beneath a p-well provided for the capacitor array so that the electrode provided by the buried, doped region will surround the capacitor portion of each trench. (Generally an isolation or other region is formed at the bottom of the trench and some portion of the upper regions of the trench may include transistors or other circuit elements or portions thereof used for accessing a particular capacitor of a memory cell.)

Such buried electrodes have been formed in known DRAM designs, such as that disclosed in U.S. Pat. No. 5,264,716 to Donald M. Kenney and assigned to the assignee of the present invention and which is hereby fully incorporated by reference, by out-diffusion of plate dopant from a diffusion source within the trench, thereby assuring that the doped region so formed will surround the capacitor portion of the trench. However, the process steps required for forming an electrode in this manner involve deposition of the dopant source, masking the vertical dopant profile and removal of the dopant source by etching, These operations involve substantial process complexity and have been found to have a substantial adverse impact on manufacturing yield.

An alternative method involves the use of an n-type substrate into which a p-type surface implantation is made prior to etching of trenches. However, while avoiding process complexity, this approach introduces some additional problems and is subject to some severe operational limitations. Specifically, the low noise and high latch-up resistance of n-well CMOS logic circuitry are sacrificed, a new latch-up mechanism is presented by the necessary p-n-p-n vertical path, the freedom to bias the plate arbitrarily is eliminated, and costs of n-type wafers meeting particular resistivity specifications are substantially higher than for p-type wafers; substantially eliminating the cost benefit of the simpler process. Further, it is not entirely clear at the present state of the art that partitions can be successfully formed consistent with this alternative process.

SUMMARY OF THE INVENTION

It is therefore an object of the present invention to provide a low-cost, high yield process for forming a buried capacitor electrode compatible with formation of a high capacity DRAM.

It is another object of the invention to provide a method of plate formation which preserves the benefits of n-well CMOS technology formed on a low-cost p-type wafer, substrate or chip which does not require out-diffusion from an impurity source or other complex process which can compromise manufacturing yield.

It is a further object of the invention to provide a low cost, high yield process suitable for p-type wafers for forming a buried electrode which can be articulated at will during manufacture and which can be arbitrarily biased in each partition so formed.

In order to accomplish these and other objects of the invention, a method of forming a buried conductive layer in a semiconductor layer or wafer is provided including the steps of implanting impurities of a first type in a region of a semiconductor layer wafer of a second impurity type, growing an epitaxial layer of semiconductor material over a region including implanted impurities of a first type, and diffusing said impurities into said epitaxial layer.

In accordance with another aspect of the invention, a method of forming a trench capacitor in a semiconductor layer or wafer is provided including the steps of implanting impurities of a first type in a region of a semiconductor layer wafer of a second impurity type, growing an epitaxial layer of semiconductor material over a region including implanted impurities of a first type, and diffusing said impurities into said epitaxial layer, forming a trench extending at least to a region having diffused impurities in the epitaxial layer, forming a dielectric layer within the trench, and forming a storage node within the dielectric layer within the trench.

In accordance with a further aspect of the invention, a dynamic random access memory device is provided comprising a body of semiconductor material, a buried plate within the body of semiconductor material having a dopant concentration which varies with depth within the body of semiconductor material, an isolation region between the buried plate and a surface of the body of semiconductor material, a trench extending at least through the isolation region and into the buried plate, a capacitor dielectric formed within the trench, and a storage node formed within the dielectric layer within the trench.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
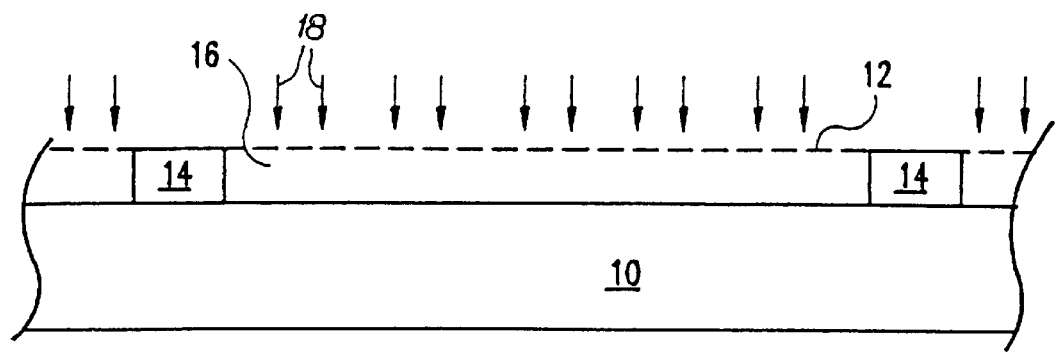
FIG. 1 is a cross-sectional view of a p-type wafer at an initial stage of a preferred implementation of a method in accordance with the invention.
Figure 2:
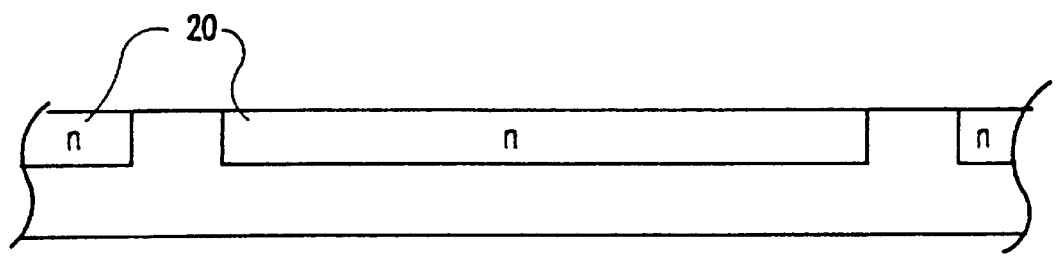
FIGS. 2, 3 and 4 are cross sectional views of the wafer at intermediate stages of a preferred form of the method in accordance with the invention.

Referring now to the drawings, and more particularly to FIG. 1, there is shown, in cross-section, a p-type wafer 10 at an initial stage of the process in accordance with the invention. The wafer is masked, as depicted by dashed line 12 and patterned to open areas 16 between remaining mask areas 14. Then, an n-type impurity implantation, indicated by arrows 18 preferably of phosphorus to a concentration between $10^{14}$ cm$^{-2}$ and $5\times10^{16}$ cm$^{-2}$ or greater at about 900 KeV, is performed in accordance with the mask to form n-type regions 20 as shown in FIG. 2. Some variation in implantation energy may be useful to develop an adequate thickness of the initial impurity concentration distribution in the implantation region 20. In theory, other n-type impurities may be used for implantation to concentrations which develop comparable conductivities in the implanted region. However, phosphorous is preferred, particularly in view of diffusion rates of phosphorus in semiconductor wafer materials.

Any known mask and patterning suitable for implantation can be used. The particular masking process used is not important to the practice of the invention and the mask is preferably removed following the implantation. The lower impurity concentration is adequate, after diffusion, to support bias conditions resulting in accumulation of the plate. Concentrations approaching or even exceeding the higher concentration would be necessary to additionally support depletion of the plate so that an arbitrary bias can be applied. It should also be recognized that a mask is not necessary except for the purpose of division or articulation of the buried electrode into partitions or limiting the extent of the buried conductor in the vicinity of other circuits of the chip, as may be desired in the memory design, and can be omitted if only a single electrode is to be formed across the entire chip or wafer, common to all capacitors which are later formed.

While not of importance to the practice of the invention, it has been found preferable at this point in the process to again mask the structure with a blocking mask and to pattern openings for etching of alignment marks, if required.

Figure 3:
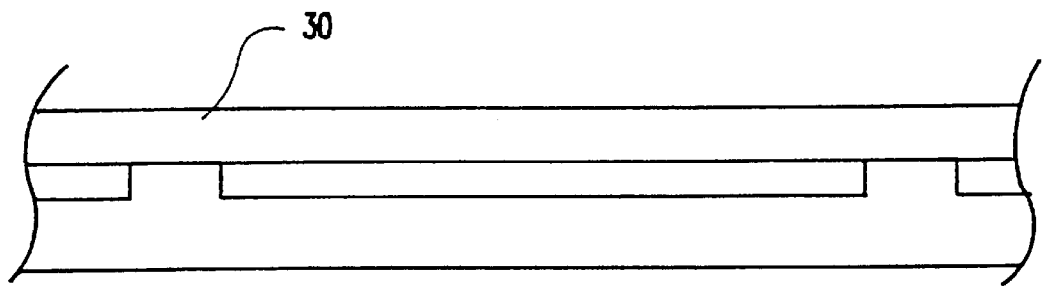

As shown in FIG. 3, an epitaxial p-type layer 30 is then grown over the surface of the wafer; effectively burying the n-type implanted region within the p-type material. The thickness of this layer is not particularly critical to the practice of the invention but the thickness should accommodate the formation of transistors above the final n-type region developed by annealing, as will be described below with reference to FIGS. 4 and 6 while being sufficiently thin to allow connections to be made to the final n-type regions by desired processes, such as a further masked implantation. A thickness of approximately 4 $\mu$m is presently preferred as a balance between these considerations in view of preferred forms of trench capacitors to be later formed.

Figure 4:
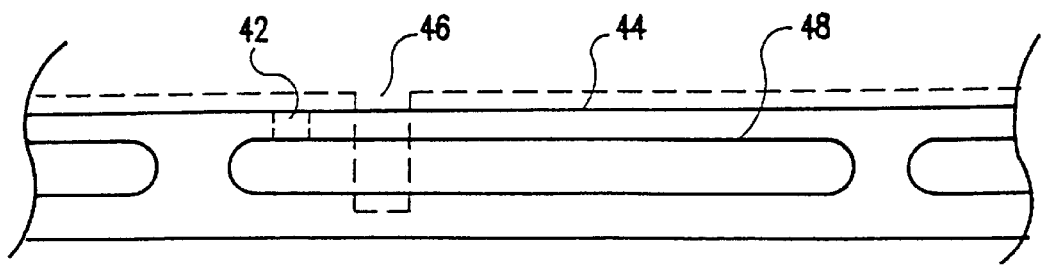
Figure 6:
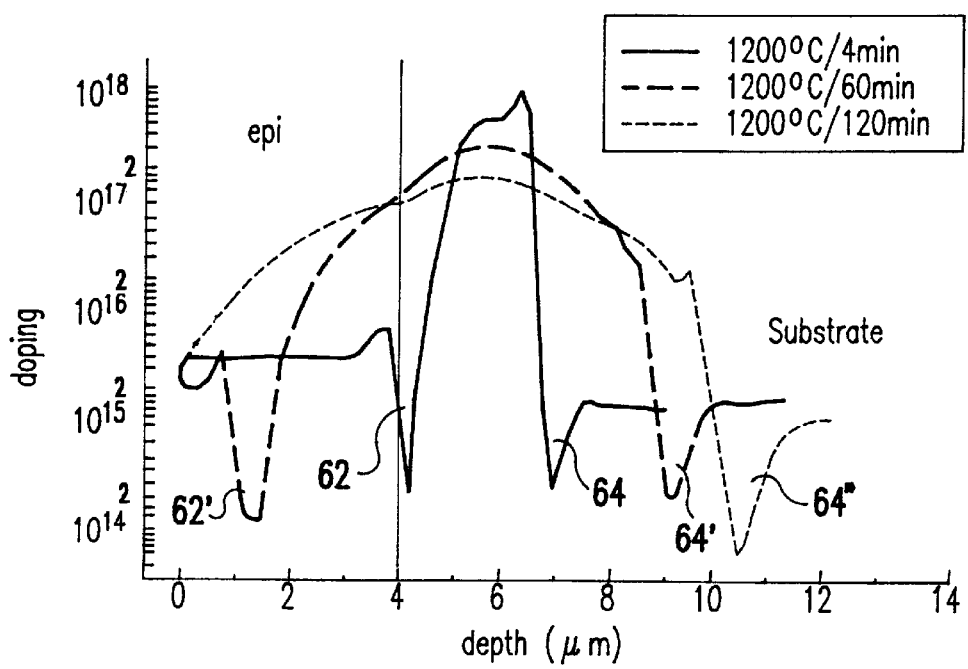
FIG. 6 is a graphical representation of as-found dopant profiles formed in accordance with the invention, as schematically represented in FIG. 4.

As shown in FIG. 4, the buried electrode is then expanded by annealing to spread the n-type implanted impurity downward into the wafer and upward into the epitaxial region by diffusion as well as to repair damage to the crystallographic structure of the wafer resulting from implantation. Quantitatively, as shown in FIG. 6, an initial implant of $10^{14}$/cm$^2$ at the preferred 900 KeV provides a sharply defined distribution peak at a depth of slightly less than 2 $\mu$m within the original wafer which, after epitaxial growth of 4 $\mu$m as shown in FIG. 3, would be depicted at a depth of slightly less than 6 $\mu$m, the approximate center of the dopant concentration peak resulting from a four minute anneal at 1200° C. shown by a solid line. As annealing proceeds with time, the center of the dopant concentration profile will remain centered at this location.

It should also be noted in consideration of FIG. 6 that the range of dopant concentrations noted above is set out as an area measure, as is the practice in the art. The dopant concentrations depicted in FIG. 6 are in volumetric measure and, since the thickness and, hence, volume of material over which the dopant is diffused is very small, the concentrations will appear several orders of magnitude larger. It should be borne in mind that the dopant concentration per unit volume will determine conductivity and whether or not a bias establishing depletion of the region (in addition to accumulation) can be supported and at what depths within the structure.

Accordingly, as diffusion proceeds over time, as shown by the dashed plot corresponding to 60 minutes and the dotted plot corresponding to 120 minutes, the peak concentration is reduced and the peak is widened. It should also be noted that the valleys such as 62 on either side of the peak which result from counter-doping also widen and deepen somewhat. These valleys are useful in providing isolation and it is therefore preferred that annealing be terminated prior to valley 62' being brought to the surface since it serves to isolate the buried conductor from circuits or devices which are formed at or on the surface of the wafer or substrate. However, if the overall doping concentrations are adequately low, such as $10^{16}/cm^3$ as shown near the surface in the 120 minute trace, isolation at a depth below the surface can be achieved by counter-doping; allowing increased flexibility in developing the final location and depth of valley 64, 64', 64" by continued annealing, if that feature is significant to the design. Whether isolation is provided by valley 62' or counter-doping, connections to the buried electrode can be made by patterned doping, an etched opening or in any other suitable manner, as generally depicted at 42 of FIG. 4, since the bulk of the buried electrode, at any desired dopant concentration possible following the initial implantation, can be brought arbitrarily near the surface as various designs may require.

It should also be understood that the actual dopant concentration varies with depth at respective points along the traces shown in FIG. 6 as well as the width (e.g. thickness) of the electrode for a given (e.g. accumulation and/or depletion) mode at a given bias. This can be regulated over a wide range by initial implantation concentration as well as annealing temperature and time; the traces of FIG. 6 corresponding to the lower extremity of the concentration range disclosed to be preferred, above. Thus, the dopant concentration, which varies with depth in accordance with the invention, provides a relatively well-defined boundary for the buried electrode for any particular bias or conduction mode. Therefore, the invention provides a very flexible methodology for developing electrodes of different dimensions and conduction qualities, as may be required in various designs of DRAMs and other semiconductor integrated circuits since initial dopant concentrations, thickness of epitaxial layer as well as the potential for developing asymmetry of the dopant concentration profile by counter-doping are all variable, at will, to meet the requirements of various designs.

Following annealing, as shown in FIG. 4, the wafer or substrate is again masked and patterned (e.g. 44) and trench 46 formed by anisotropic etching; many suitable techniques for which are well-known in the art. In this regard, outline 48 of the buried electrode represents any arbitrary dopant concentration level which will support a desired conductance at that location and bias (which may vary the location of the illustrated boundary somewhat) or the locations of valleys 62', 64' which provide isolation. In any event, the buried conductor formed in accordance with the invention has been found, in practice, to present relatively well-defined boundaries to or through which trench 46 may readily be formed and will thus define an area within the trench which will function as a capacitor upon formation of a dielectric and a further electrode (which would serve as a memory cell storage node of a DRAM).

Figure 5:
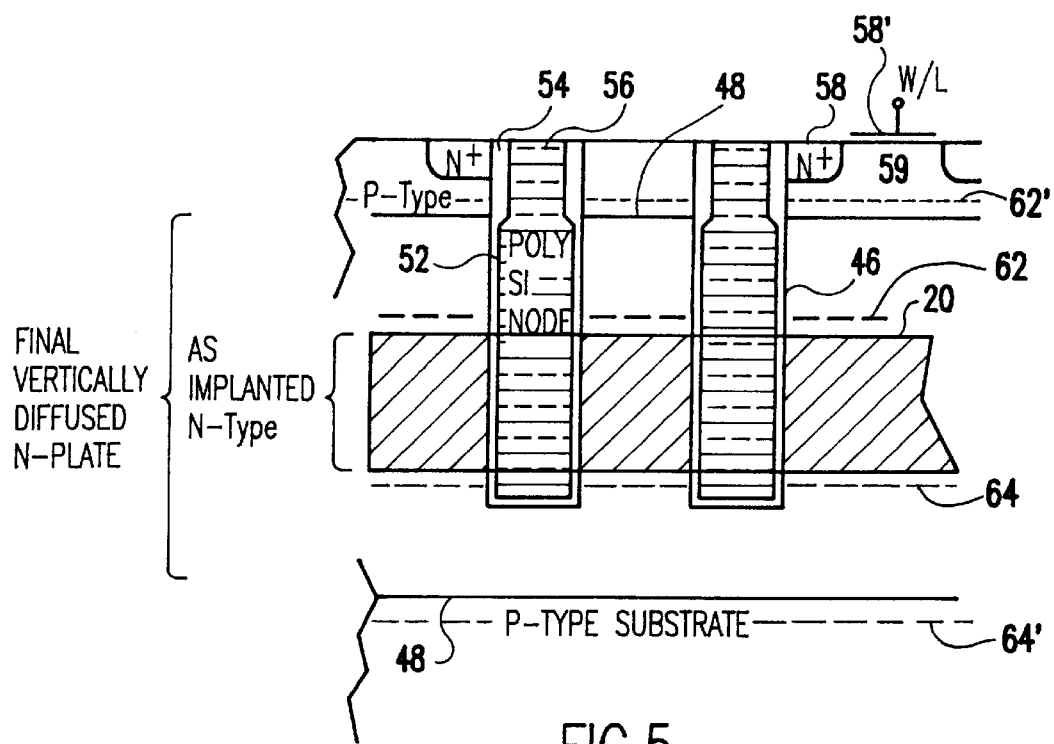
FIG. 5 is a cross-sectional view of a completed capacitor structure formed in accordance with the method of the invention.

Once trench 46 is formed, fabrication of the remainder of the capacitor structure can proceed in any known manner and in accordance with any design since the remainder of the process is not considered to be critical to the practice of the invention. An exemplary trench capacitor structure is shown in FIG. 5, including depiction of the original boundary of the implantation region 20 and the final boundary 48 of the buried electrode achieved by diffusion. Trenches 46 terminate within the buried electrode and isolation from the substrate is provided by lower electrode boundaries corresponding to dopant profile valleys 62', 64', respectively.

Within the trenches 46, a capacitor dielectric 52 is formed, preferably as an oxide-nitride-oxide (ONO) sandwich. Dielectric thickness may be increased or a connector or collar (e.g. 54) formed near the surface of the trench, as desired, and the remainder of the trench filled with polysilicon 56. Further connections may be formed by metallization or doping which may also form a conduction terminal 58 of a transistor 58' used to access or otherwise control the cell. Such a transistor may also be formed in a well 59 of opposite conductivity type if required by the design so long as the depth of the well remains above the electrode boundary 48 (although for some anticipated bias levels, a connection therebetween could be desirable).

In view of the foregoing, it is seen that the invention provides a low-cost, high yield process for forming a buried electrode which is of substantial flexibility for accommodation of a variety of designs, particularly designs for DRAMs including trench capacitors. The invention preserves the benefits of N-well CMOS technology and can be formed on low-cost p-type wafers or substrates while avoiding the process complexity of out-diffusion from dopant diffusion sources deposited in the trenches. The electrode formed in accordance with the invention can also support an arbitrary bias or range thereof, as may be required by an integrated circuit design and can be articulated and/or bounded at will, for example, to form memory partitions or accommodate other circuits such as decoders, sense amplifiers and peripheral circuits.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A dynamic random access memory device comprising:
   a body of semiconductor material said body comprising a first single crystalline region of a first conductivity type and having a predetermined dopant concentration and said body having an epitaxial layer of said first conductivity type and having a predetermined dopant concentration in contact with said single crystalline region,
   a buried plate of opposite conductivity type within said body of semiconductor material, said buried plate having a dopant concentration which varies with depth within said body of semiconductor material, said buried plate dopant concentration having a peak magnitude greater than said predetermined dopant concentration of said body and said peak being located within said first single crystalline region and below the interface between said epitaxial layer and said single crystalline region; said buried plate dopant concentration having a peak dopant concentration less than about $1\times10^{17}$ impurity atoms per cubic centimeter and having a diffused dopant concentration profile exceeding that of the predetermined concentration of said epitaxial layer extending to within less than one micron of the surface of said epitaxial layer, whereby a carrier depletion region is formed within said body of semiconductor material extending between said buried plate and said surface of said body of semiconductor material, said depletion region being formed by the intersection of the buried plate dopant concentration profile and the dopant concentration profile of said epitaxial layer;

a trench extending through said depletion region and into said buried plate;

a capacitor dielectric layer formed within said trench; and a storage node in contact with said capacitor dielectric layer within said trench.

2. A memory device as recited in claim 1, wherein said epitaxial layer has a thickness of approximately 4 $\mu$m.

3. A memory device as recited in claim 1, wherein the dose of impurities implanted to form said buried plate in said semiconductor layer is between $10^{14}$ ions cm$^{-2}$ and $10^{16}$ ions cm$^{-2}$.

* * * * *